United States Patent

Lee

[11] Patent Number: 6,033,811
[45] Date of Patent: Mar. 7, 2000

[54] OPTICAL PROXIMITY CORRECTION MASK FOR SEMICONDUCTOR DEVICE FABRICATION

[75] Inventor: Jun Seok Lee, Seoul, Rep. of Korea

[73] Assignee: LG Semicon Co., Ltd., Seoul, Rep. of Korea

[21] Appl. No.: 09/134,374

[22] Filed: Aug. 14, 1998

[30] Foreign Application Priority Data

Jan. 21, 1998 [KR] Rep. of Korea ......................... 98/1660

[51] Int. Cl.[7] .................................................. G03F 9/00
[52] U.S. Cl. ........................................................... 430/5
[58] Field of Search ................................ 430/5, 322, 22; 395/500.22, 500.2

[56] References Cited

U.S. PATENT DOCUMENTS

| | | | |
|---|---|---|---|
| 5,458,998 | 10/1995 | Takekuma et al. | 430/5 |
| 5,553,273 | 9/1996 | Liebmann | 395/500 |
| 5,705,301 | 1/1998 | Garza et al. | 430/5 |
| 5,725,973 | 3/1998 | Han et al. | 430/5 |

OTHER PUBLICATIONS

Pratical Optical Proximity Effect Correction Adopting Process Latitude Consideration, Keisuke Tsudaka et al., Jpn. J. Appl. Phys. vol. 34 (1995) pp. 6552–6559, Part 1, No. 12B, Dec. 1995.

Evaluation of Proximity Effects Using Three–Dimensional Optical Lithography Simulation, Chris A. Mack, 634/SPIE vol. 2726, pp. 634–639.

Evaluation of OPC Efficacy, F.M. Schellenberg et al., 680/ SPIE vol. 2726, pp. 680–688.

Primary Examiner—S. Rosasco

[57] ABSTRACT

A mask for fabricating a semiconductor device, which is capable of correcting an optical proximity effect, includes a transparent mask plate, a main pattern formed on the mask plate as a light blocking layer, and a subsidiary pattern a corner of which is offset in a direction of 45±10 degrees or 135±10 degrees from a line longitudinally extended from the main pattern's edge line. The corner of the subsidiary pattern may be contiguous or non-contiguous with a corner of the main pattern.

15 Claims, 7 Drawing Sheets

OPTICAL PROXIMITY CORRECTION MASK FOR SEMICONDUCTOR DEVICE FABRICATION

BACKGROUND OF THE INVENTION

1. Field of the Invention

The present invention relates to a mask for used in the fabrication of a semiconductor device, and in particular to an improved optical proximity correction mask (OPCM) for use in fabricating a semiconductor device of which a pattern is corrected in order that a pattern, which is actually printed on a semiconductor substrate, may be fabricated approximate to a desired pattern.

2. Description of the Conventional Art

In a lithography process which employs a light source such as g-line, i-line, or deep ultra violet (DUV), etc., various methods are being studied to overcome a resolution limit. As a part of the studies therefor, in a mask fabrication technique, an optical proximity correction mask (OPCM) is regarded as one of the most effective techniques compared with a phase shift mask (PSM). Particularly, compared with the PSM, the OPCM has a property of a binary mask which is provided only with a light blocking layer and a light projection layer, and thus using the OPCM is more advantageous in terms of manufacturing cost, effectiveness, etc.

In a case where the lithography process using a conventional general mask is performed, the size and shape of a photoresist pattern which is printed onto a semiconductor substrate may be different from that of a pattern of the mask due to an optical proximity effect (OPE). That is, because a lens employed in exposing the pattern of the mask to the light is curved, a corner rounding error of the photoresist pattern printed onto the semiconductor substrate may be occurred, and more excessive corner rounding error leads to a problem such as line shortening in which the length of the pattern is shortened. As a result, the quality and yield of the semiconductor devices are deteriorated. In order to solve the above problems, that is in order that a pattern having a desired shape may be printed onto the semiconductor substrate, an optical proximity correction is compensatorily provided, wherein the pattern printed on the mask is pre-distorted in the direction opposite to which the lens is curved, and a mask having such a distorted pattern is known as an optical proximity correction mask.

With reference to the accompanying drawings, some conventional optical proximity correction masks will be described.

Figure 1A:
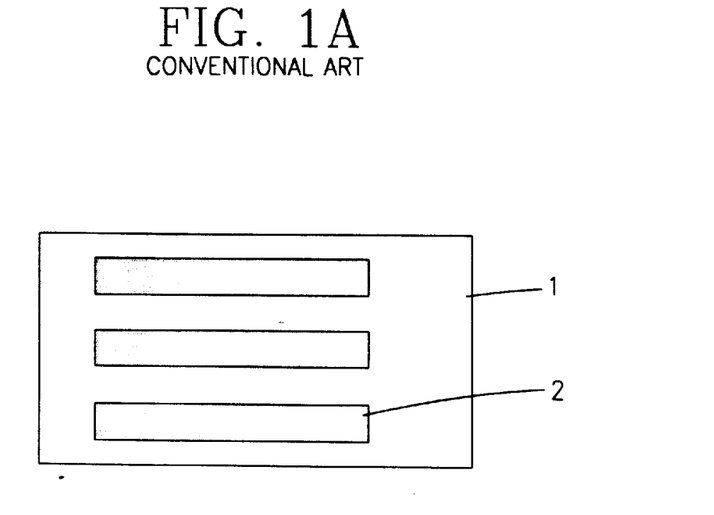
FIG. 1A is a plane layout diagram of a conventional mask for fabricating a semiconductor device.
Figure 1B:
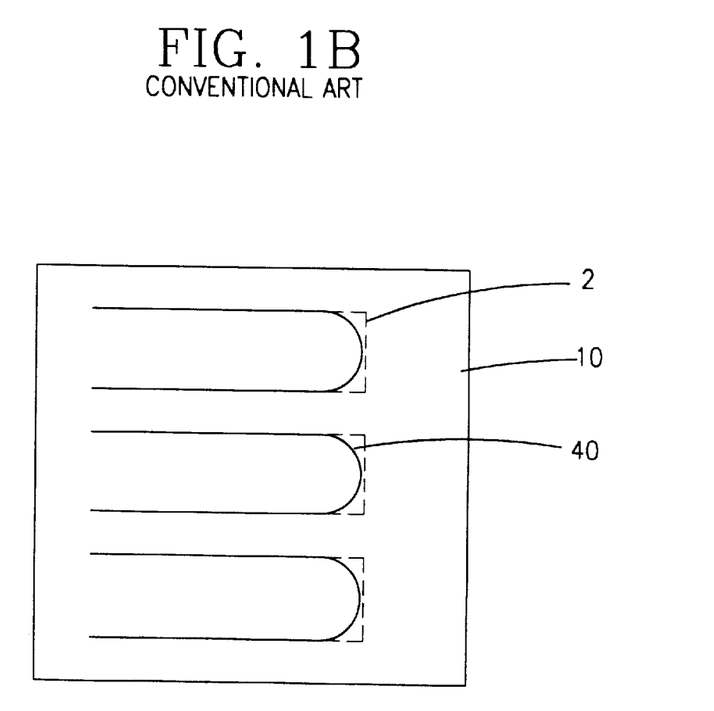
FIG. 1B is a diagram illustrating the pattern printed onto a semiconductor substrate by using the mask of FIG. 1A.

FIG. 1A illustrates the layout of a typical mask without optical proximity correction, wherein main patterns 2 which serve as a light blocking layer are formed on a transparent mask plate 1. FIG. 1B illustrates the shape of the pattern printed onto a semiconductor substrate by irradiating the mask shown in FIG. 1A. That is, the main patterns 2 of the mask when printed onto the semiconductor substrate 10 have the shape of the patterns 40. In order to easily compare the main pattern 2 of the mask with the patterns 40 printed onto the semiconductor substrate 10, the two patterns are superimposed with the main pattern 2 shown by dashed lines in FIG. 1B. Here, the shape of the main pattern 2, to be obtained on the semiconductor substrate 10 by using the mask of FIG. 1A, is a rectangle having square corners. However, the pattern 40 which is actually printed onto the semiconductor substrate has excessively rounded corners due to the optical proximity effect.

When corners are excessively rounded as in the patterns 40, the length and width of the patterns may be shortened, thereby decreasing the reliability of the semiconductor device.

Figure 2A:
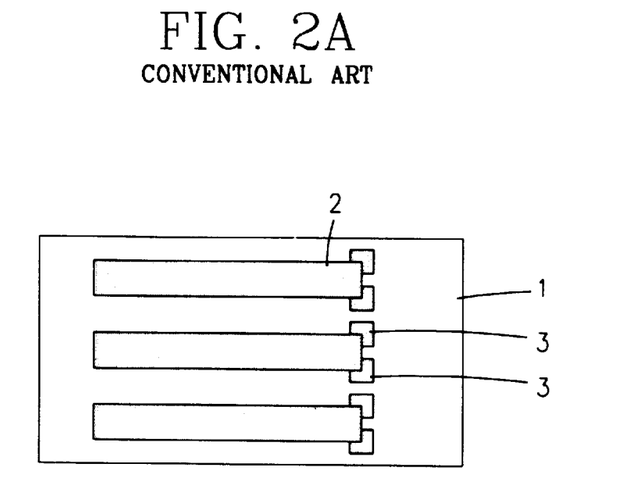
FIG. 2A is a plane layout diagram of a conventional optical proximity correction mask.
Figure 2B:
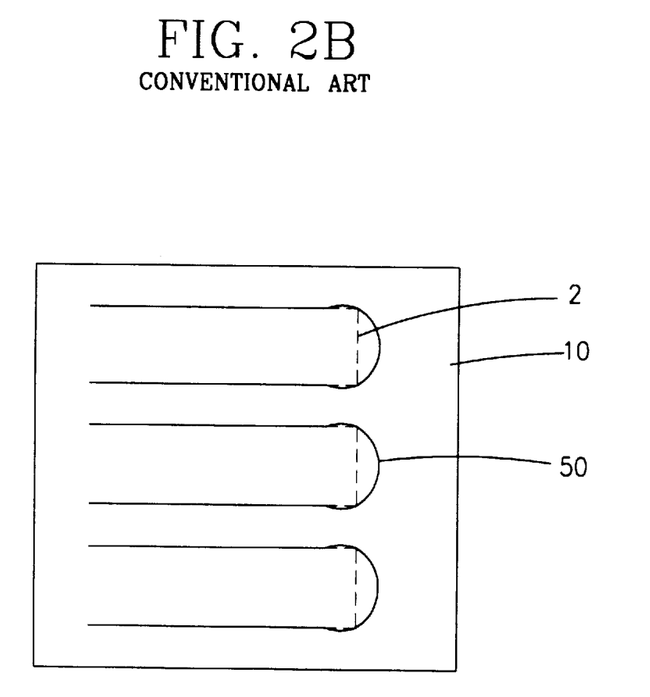
FIG. 2B is a diagram illustrating the pattern printed onto a semiconductor substrate by using the conventional optical proximity correction mask of FIG. 2A.

Accordingly, an optical proximity correction mask may be utilized to solve the above problem. FIG. 2A is a diagram illustrating a conventional optical proximity correction mask, and FIG. 2B illustrates a pattern printed onto a semiconductor substrate by using the mask in FIG. 2A.

Figure 3A:
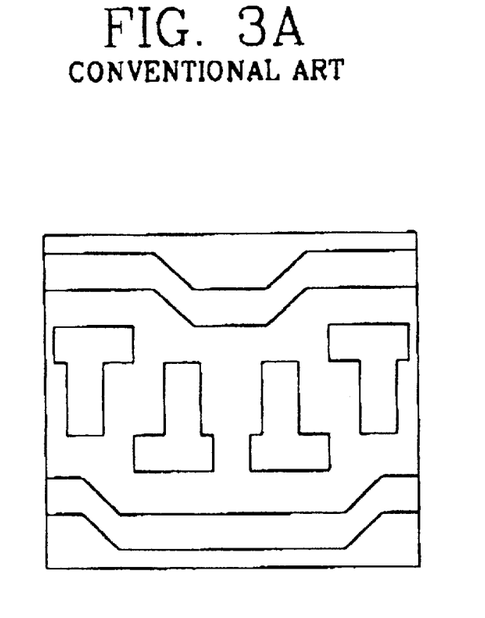
FIG. 3A is a diagram illustrating another example of a conventional mask for a semiconductor device.
Figure 3B:
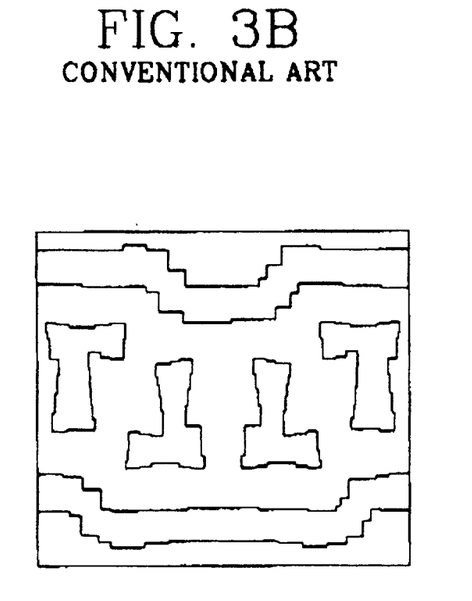
FIG. 3B is a diagram illustrating a conventional proximity correction mask corresponding to the conventional mask of FIG. 3A.

As shown in FIG. 2A, the main patterns 2 serving as the light blocking layer are formed on the mask plate 1, and subsidiary patterns 3 are formed joined to the line edge of each corner of the main patterns 2. Here, as shown in FIG. 2A, the subsidiary pattern 3 outwardly distorts from the line edges of the main pattern 2 to compensate for the effect that when printing the pattern 2 onto the semiconductor substrate, the shape of the thusly printed pattern has rounded corners, thus being inwardly distorted compared to the main pattern 2. As shown in FIG. 2A, the conventional optical proximity correction mask is provided by joining the subsidiary patterns 3 to the line edges of the main patterns 2. FIG. 2B illustrates the pattern 50 printed onto the semiconductor substrate 10 by using the conventional optical proximity correction mask of FIG. 2A. To easily compare the pattern 50 to the main pattern 2 of the mask, the two patterns are superimposed with the main pattern 2 shown by dashed lines in FIG. 2B. The corner rounding error of the pattern 50 printed on the semiconductor substrate 10 is improved compared to the pattern 40 of FIG. 1B which is printed by using the plane mask. However, the width and length of the pattern 50 are wider and longer than that of the actual mask, thus the pattern 50 is outwardly formed larger than the main pattern 2 of the mask, causing what is called an over-shoot. Accordingly, in order to overcome the over-shoot, another subsidiary pattern for correction may be added to the main pattern 2 of the mask, or the size and/or number of the subsidiary patterns 3 previously provided may be reduced. That is, a repetition of adding and removing a new subsidiary pattern to and from a proper position must be formed until the pattern 50 printed onto the semiconductor substrate 10 approximates to the main pattern 2 of the mask plate 1 as shown in FIG. 2A. The above problem results because a lens is used in the light exposure apparatus, and thus the optical proximity effect occurs. FIG. 3A illustrates a plane layout of a typical mask having complicated-shaped main patterns, and FIG. 3B illustrates an example of the conventional optical proximity correction mask after applying a plurality of subsidiary patterns to the mask of FIG. 3A.

Since a large number of subsidiary patterns are employed for the conventional optical proximity correction mask, the amount of data required for generating the mask patterns is increased, and thus the data processing speed slows down, and a mask test becomes harder. In addition, when the main patterns are close to each other, the distance between adjacent patterns becomes narrower as the subsidiary patterns are added thereto, and therefore a pattern bridge or a butting of the patterns can arise, whereby the resolution of the mask is deteriorated.

SUMMARY OF THE INVENTION

Accordingly, it is an object of the present invention to provide a mask for a semiconductor device having a subsidiary pattern which is not contiguous with a line edge of a mask main pattern. That is, the subsidiary pattern is provided in the direction of an angle of ±45 degrees from a line extended from each corner of the main pattern, and is not contiguous with the line edge of the main pattern, thus effectively preventing a corner rounding error and an over-shoot.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

With reference to accompanying drawings, an optical proximity correction mask according to the present invention will be described in detail.

Figure 4A:
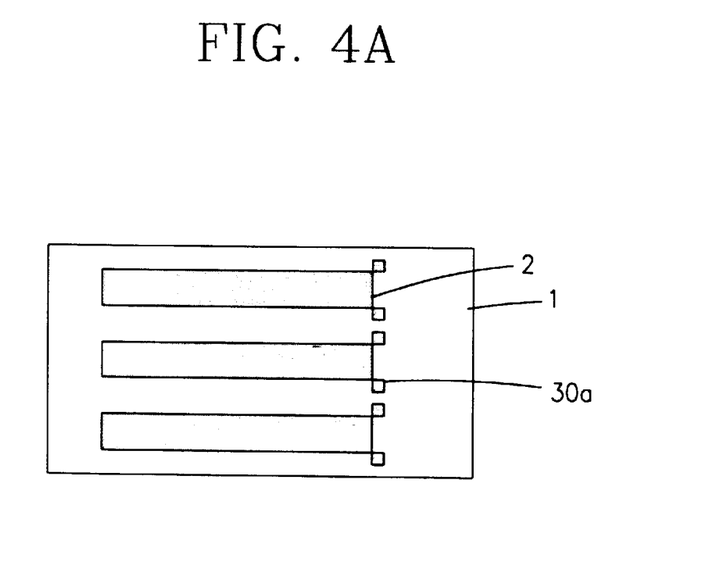
FIG. 4A is a plane layout diagram of an optical proximity correction mask according to a first embodiment of the present invention.

FIG. 4A is a plane layout diagram illustrating an optical proximity correction mask according to a first embodiment of the present invention.

As shown therein, main patterns 2 each serving as a light blocking film are provided on a transparent mask plate 1, and in the vicinity of the corners of each of the main patterns 2, a rectangular subsidiary pattern 30a is located diagonally juxtaposed, that is offset at an angle of 45±10 degrees or 135±10 degrees from a line linearly extended from each of the corners of the main pattern. When the subsidiary patterns 30a are located at an angle of 45 degrees or 135 degrees from the lines projected from the corners of the main pattern 2, two side edges of the subsidiary pattern 30a align with the lines projected from the corners of the main patterns 2. The size of the subsidiary pattern 30a is formed to be within ±30% of the width of a critical line in order not to exceed the resolution limit of a light source. Also, the subsidiary patterns 30a may be also formed as light blocking patterns, or as a light transmitting patterns having a phase which is reverse to the transparent mask plate 1.

Figure 4B:
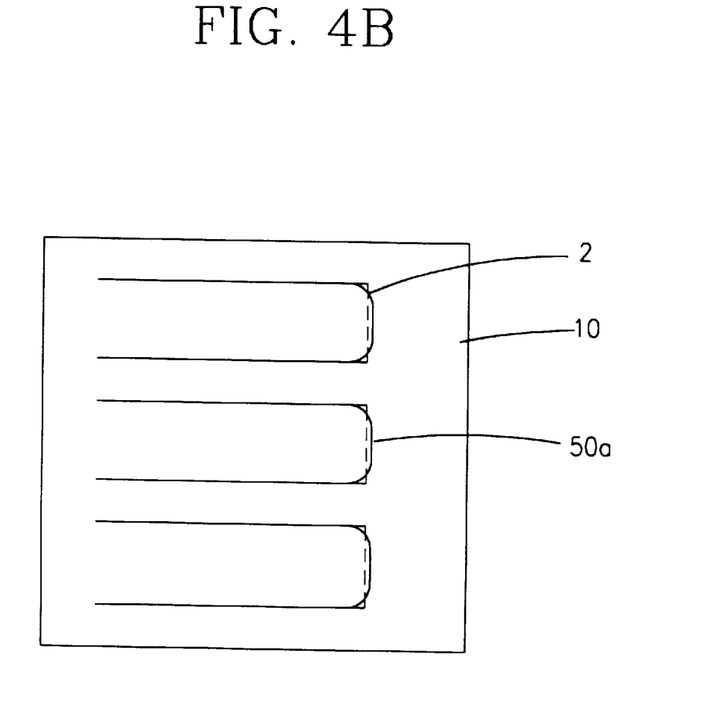
FIG. 4B is a diagram illustrating the pattern printed onto a semiconductor substrate by using the mask of FIG. 4A.

FIG. 4B shows a pattern printed onto the semiconductor substrate by exposing the mask as shown in FIG. 3A to the light under conditions of a 365 nm(i-line) wavelength, 0.55 N.A., 0.6 partial coherence δ, and 5× reduction rate. That is, as shown therein, the mask according to the present invention may improve the corner rounding error and form a fine pattern having less over-shoot, compared to the conventional optical proximity correction mask.

Figure 5A:
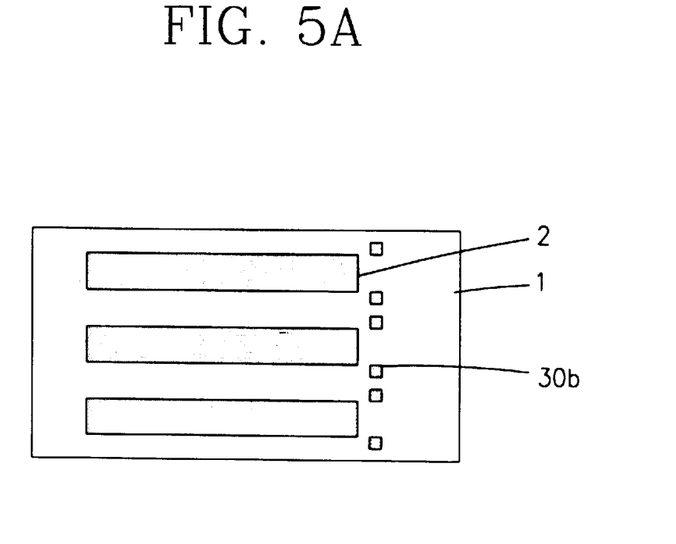
FIG. 5A is a plane layout diagram illustrating an optical proximity correction mask according to a second embodiment of the present invention.

FIG. 5A is a layout diagram illustrating an optical proximity correction mask according to a second embodiment of the present invention. While the mask according to the first embodiment of the present invention adopts the subsidiary patterns 30a juxtaposed to the corners of the main patterns 2 on the transparent mask plate 1 as shown in FIG. 4A, the mask according to the second embodiment of the present invention adopts subsidiary patterns 30b which are distanced apart from the corners of the main patterns 2 diagonally at |45|±10° or |35|±10°. Here, the distance between the corners of the main pattern 2 and the subsidiary patterns 30b is obtained by the following formula.

$$0 \leq \sqrt{\{[SCDmy/2 - Ya]^2 + Xa^2\}} \leq SCDmy/2$$

wherein SCDmy is the minimum distance between the main patterns, Xa is the length of the main and subsidiary patterns, and Ya is the width of the main and subsidiary patterns.

Figure 5B:
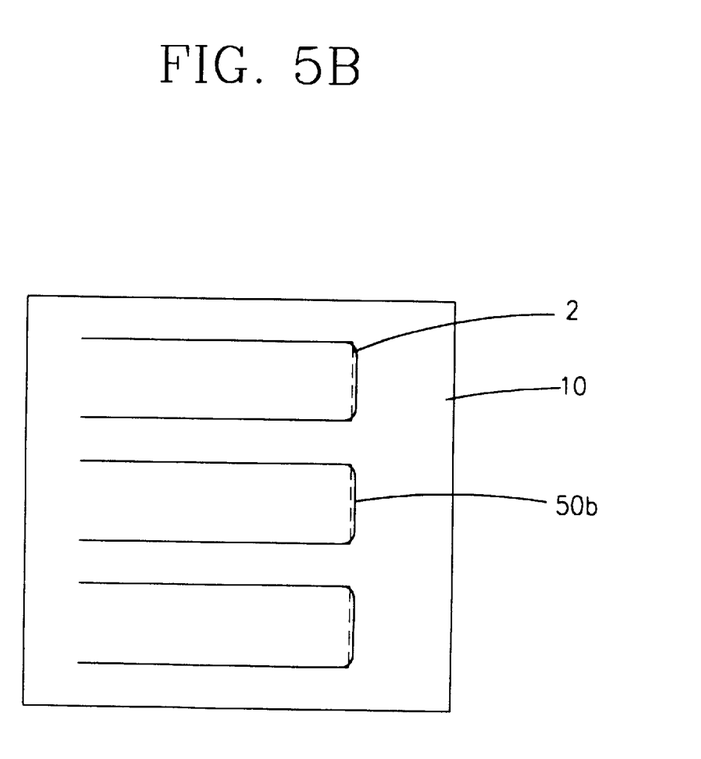
FIG. 5B is a diagram illustrating the pattern printed onto a semiconductor substrate by using the mask of FIG. 5A.

FIG. 5B shows the pattern printed onto the semiconductor substrate by exposing the mask as shown in FIG. 5A to light under the same conditions as described for the first embodiment.

As shown therein, the patterns 50b are printed onto the semiconductor substrate 10, and the shape thereof is very close to that of the main patterns 2 of the optical proximity correction mask as shown in FIG. 5A. Therefore, it clearly shows that using the optical proximity correction mask according to the second embodiment of the present invention may obtain a better result than using the mask according the first embodiment. Placing the subsidiary patterns 30b distanced from the corners of the main patterns 2 can effectively prevent a pattern distortion resulting from the optical proximity effect.

Figure 6:
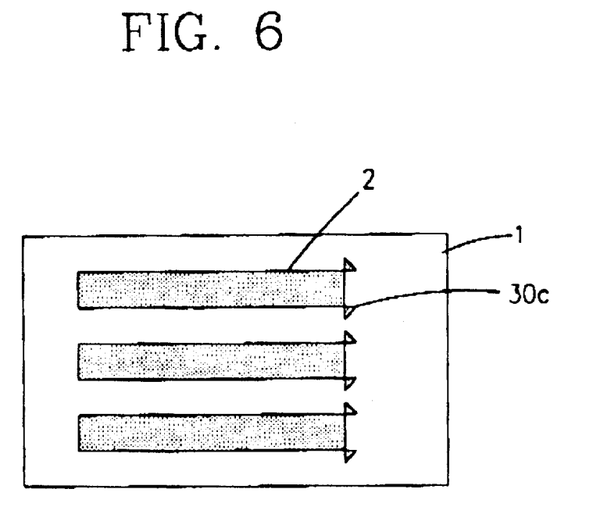
FIG. 6 is a plane layout diagram illustrating an optical proximity correction mask according to a third embodiment of the present invention.

FIG. 6 is a diagram illustrating an optical proximity correction mask according to a third embodiment of the present invention.

As shown therein, except for the shape of the subsidiary patterns which are each a right-angled triangle, the mask according to the third embodiment is formed the same as the mask according to the first embodiment. In the same manner as for the third embodiment, first, a main pattern 2 is formed on a transparent mask plate 1, and by projecting an extension line having an angle of 45±10 degrees or 135±10 degrees from a line which is horizontally projected from each corner of the main pattern 2, the right angles of the right-angled triangles of the subsidiary pattern 30c are located on the projection lines, and thus the size of the subsidiary patterns 30c can be reduced. That is, in the case where a pattern density of the main patterns is high, applying the smaller-sized subsidiary patterns 30c as shown in FIG. 6 can prevent the subsidiary patterns from making contact with each other, and reduce the area occupied by the subsidiary patterns.

Figure 7:
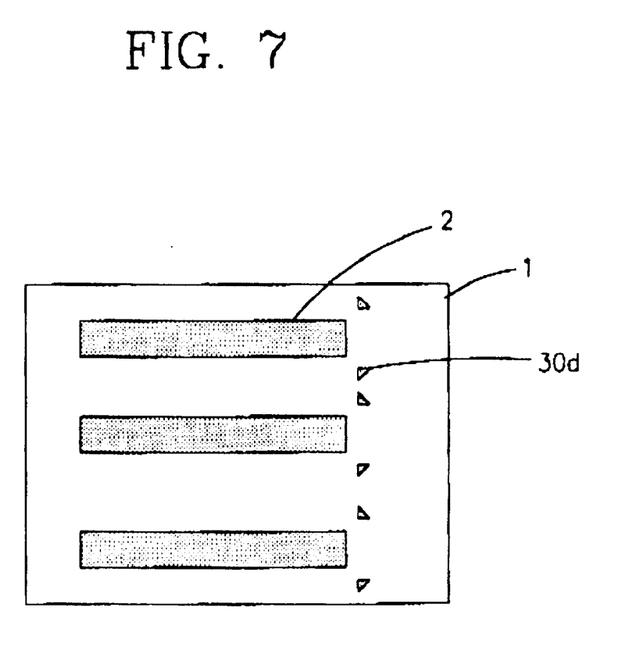
FIG. 7 is a plane layout diagram illustrating an optical proximity correction mask according to a fourth embodiment of the present invention.

FIG. 7 is a diagram illustrating an optical proximity correction mask according to a fourth embodiment of the present invention.

As shown therein, main patterns 2 and subsidiary patterns 30d are formed on a transparent mask plate 1. Except for the shape of the subsidiary patterns which 30b are right-angled triangles, the mask according to the fourth embodiment is formed the same as the mask according to the second embodiment. Similarly, the mask according to the fourth embodiment also prevents the subsidiary patterns from coming into contact with the main patterns, and reduces the area size occupied by the subsidiary patterns in the case where the pattern density of the main patterns is high. Here, it is desirable that the distance between each corner of the main patterns 2 and the right angle of the subsidiary patterns 30d, the right-angled triangles, ranges from 0 to SCDmy/2.

Figure 8:
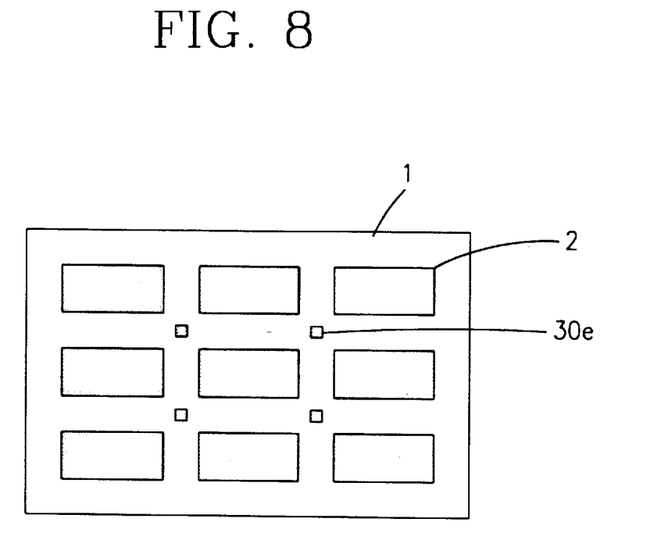
FIG. 8 is a plane layout diagram illustrating an optical proximity correction mask according to a fifth embodiment of the present invention.

FIG. 8 is a diagram illustrating an optical proximity correction mask according to a fifth embodiment of the present invention. As shown therein, main patterns 2 and subsidiary patterns 30e are formed on a transparent mask plate 1, and when the plurality of main patterns 2 are compactly provided on the transparent mask plate 1, that is when some of subsidiary patterns 30e have a partly overlapped portion with another subsidiary pattern 30e, the plurality of subsidiary patterns become simplified into a single subsidiary pattern. Here, the angle between the corners of the main patterns 2 and the corners of the subsidiary patterns 30e should be maintained at |45|±10° or |135|±10°.

Figure 9:
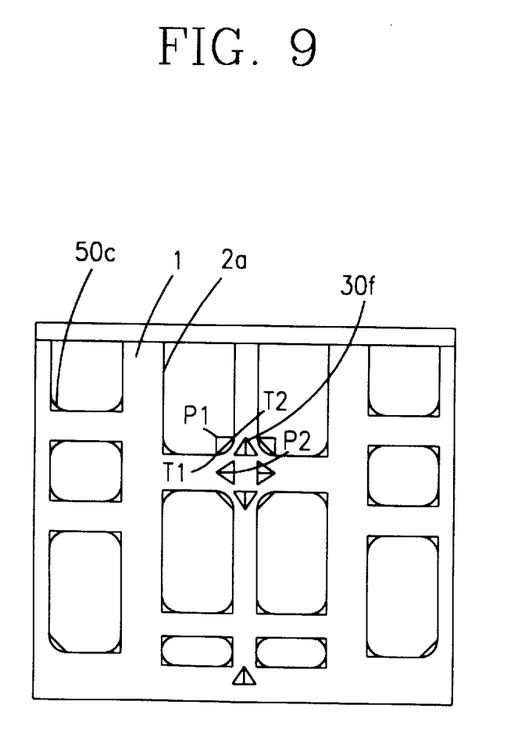
FIG. 9 is a plane layout diagram illustrating an optical proximity correction mask according to a sixth embodiment of the present invention.

FIG. 9 is a diagram illustrating an optical proximity correction mask according to a sixth embodiment of the present invention. If the angle of a corner of a main pattern is not 90 degrees, and if two or more corners of one main pattern are adjacent to two and more corners of other main patterns, the size of a subsidiary pattern can be reduced by employing a triangularly shaped subsidiary pattern. As shown in FIG. 9, a plurality of main patterns 2a are formed on a transparent mask plate 1, wherein each main pattern 2a has corners T1 and T2, and each of the corners T1 and T2 are facing two or more corners of other adjacent main patterns. Here, subsidiary patterns 30f are formed with a triangular shape. In determining the location of the subsidiary patterns 30f with respect to the main patterns 2a, vertical and horizontal extension lines of the main pattern 2 are projected from each of the corners T1 and T2 of the main patterns 2, and a line is projected from a meeting point P1 of the extension lines, to have an angle of 45±10 degrees or 135±10 degrees with respect to the horizontal extension line of the main patterns 2a, and then the subsidiary patterns 30f are placed so that an angle P2 of the subsidiary patterns 30f may be located on the line extended from the meeting point P1.

As described above, the optical proximity correction mask according to the present invention is capable of remarkably improving a corner rounding error, reducing a mask pattern data amount due to a reduction in the number of subsidiary patterns, and forming a subsidiary pattern without deterioration of the resolution, even in the case where the distance between each main pattern is narrow, thus enhancing the reliability of a semiconductor device.

Although the preferred embodiment of the present invention has been disclosed for illustrative purposes, those skilled in the art will appreciate that various modifications, additions and substitutions are possible, without departing from the scope and spirit of the invention as recited in the accompanying claims.

What is claimed is:

1. A mask for fabricating a semiconductor device, comprising:

a mask plate;

a main pattern formed on the mask plate; and a subsidiary pattern a corner of which is offset in a direction of 45±10 degrees or 135±10 degrees relative to a line extended from the main pattern's edge line, and which exhibits the same phase and amplitude under an exposure irradiation as that of the main pattern.

2. The mask of claim 1, wherein a corner of the main pattern which serves as a light blocking layer, is contiguous with a corner of the subsidiary pattern.

3. The mask of claim 1, wherein a corner of the main pattern which serves as the light blocking layer, is non-contiguous with a corner of the subsidiary pattern.

4. The mask of claim 3, wherein a distance between respective proximate corners of the main and subsidiary patterns ranges from 0 to SCDmy/2 where SCDmy is the minimum distance between adjacent main patterns.

5. The mask of claim 4, wherein corners of respective main patterns are closely spaced from one another and a single-subsidiary pattern is formed at an intersection of lines longitudinally extended from each main pattern's edge line in a direction of 45±10 degrees or 135±10 degrees therefrom.

6. The mask of claim 1, wherein two edges of the subsidiary pattern are located on lines which are horizontally and vertically extended from the main pattern's edge lines.

7. The mask of claim 1, wherein a phase difference between the main pattern and subsidiary pattern with repect to an exposure irradiation source is approximately 0 degree or 180 degrees.

8. The mask of claim 1, wherein a maximum width of the subsidiary pattern is not resolved on an exposed semiconductor substrate with respect to the wavelength of an exposure irradiation source.

9. The mask of claim 1, wherein the subsidiary pattern has a right-angled triangular shape.

10. The mask of claim 1, wherein the subsidiary pattern has a rectangular shape.

11. The mask of claim 1, wherein the subsidiary pattern is composed of a plurality of polygons.

12. The mask of claim 11, wherein parts of the subsidiary patterns may be in contact with each other, but not overlapped with one another.

13. The mask of claim 1, wherein the mask plate is an optically transparent plate, and the main pattern is a light blocking layer.

14. The mask of claim 13, wherein the subsidiary pattern is formed of a light blocking layer.

15. The mask of claim 1, wherein when an angle of a corner of the main pattern is not 90 degrees, and corners of the main patterns are adjacent each other, the subsidiary pattern has a right-angled triangular shape.

* * * * *